United States Patent [19]

Garg et al.

[11] Patent Number: 5,006,371
[45] Date of Patent: Apr. 9, 1991

[54] LOW TEMPERATURE CHEMICAL VAPOR DEPOSITION METHOD FOR FORMING TUNGSTEN AND TUNGSTEN CARBIDE

[75] Inventors: Diwakar Garg, Macungie; Ernest L. Wrecsics, Bethlehem; Leslie E. Schaffer, Macungie; Carl F. Mueller, Easton; Paul N. Dyer, Allentown; Keith R. Fabregas, Easton, all of Pa.

[73] Assignee: Air Products and Chemicals, Inc., Allentown, Pa.

[21] Appl. No.: 490,184

[22] Filed: Mar. 8, 1990

Related U.S. Application Data

[60] Division of Ser. No. 389,206, Aug. 2, 1989, Pat. No. 4,927,713, which is a continuation-in-part of Ser. No. 153,738, Feb. 8, 1988, Pat. No. 4,855,188.

[51] Int. Cl.$^5$ .................... C23C 16/08; C23C 16/32
[52] U.S. Cl. .................... 427/249; 427/250; 427/252; 427/253; 427/255.2; 427/255.1; 427/404; 427/405; 427/417.7
[58] Field of Search .................. 427/249, 255.2, 255.7, 427/250, 252, 253, 404, 405, 419.7, 304, 305, 437, 438

[56] References Cited

U.S. PATENT DOCUMENTS

| | | | |
|---|---|---|---|
| 2,872,350 | 2/1959 | Homer et al. | 427/249 |
| 3,150,938 | 9/1964 | Pelton et al. | 427/249 |
| 3,230,110 | 1/1966 | Smith | 427/249 |
| 3,368,914 | 2/1968 | Darnell et al. | 427/249 |
| 3,389,977 | 6/1968 | Tarver | 29/195 |
| 3,574,672 | 4/1971 | Tarver | 427/249 |
| 3,721,577 | 3/1973 | Woerner | 427/249 |
| 3,814,625 | 6/1974 | Lewin et al. | 427/249 |
| 4,741,975 | 5/1988 | Naik et al. | 428/621 |
| 4,761,346 | 8/1988 | Naik | 428/627 |

FOREIGN PATENT DOCUMENTS

| | | | |
|---|---|---|---|
| 690007 | 7/1964 | Canada | 427/249 |
| 61-157681 | 7/1986 | Japan | 427/249 |
| 62-290871 | 12/1987 | Japan | 427/249 |

*Primary Examiner*—Norman Morgenstern
*Assistant Examiner*—Margaret Bueker
*Attorney, Agent, or Firm*—Richard A. Dannells, Jr.; James C. Simmons; William F. Marsh

[57] ABSTRACT

An improved highly erosive and abrasive wear resistant multi-layered coating system on a substrate which provides protection against impact of large particles is disclosed comprising a plurality of composite layers. In each of the composite layers, the first layer closest to the substrate comprises tungsten of sufficient thickness to confer substantial erosion and abrasion wear resistance characteristics to the coating system and a second layer deposited on the first layer comprises a mixture of tungsten and tungsten carbide and the tungsten carbide comprises $W_2C$, $W_3C$, or a mixture of both. Because the resulting coating system has enhanced high cycle fatigue strength over the substrate, the coating system is especially useful on such structures as turbine blades and similar articles of manufacture where such chemical vapor depositing the first and second layers at a temperature in the range of about 300° to about 550° C. and then repeating the chemical vapor deposition steps to achieve the multi-layered coating system such that the overall thickness of the system is at least about 20 μm.

13 Claims, 2 Drawing Sheets

LOW TEMPERATURE CHEMICAL VAPOR DEPOSITION METHOD FOR FORMING TUNGSTEN AND TUNGSTEN CARBIDE

FIELD OF THE INVENTION

This application is a division of application Ser. No. 07/389,206, filed Aug. 2, 1989, now U.S. Pat. No. 4,927,713, issued May 22, 1990, which patent is a continuation-in-part of application Ser. No. 07/153,738 filed Feb. 8, 1988, now U.S. Pat. No. 4,855,188, issued Aug. 8, 1989, all of which are assigned to the assignee of the present application.

This invention relates to a highly erosive and abrasive wear resistant composite coating system. More particularly, the invention relates to an improved highly erosive and abrasive wear resistant multi-layered coating system on a substrate comprising two or more composite layers and a method for applying such a system on substrates. In each of the composite layers, the first layer toward the substrate comprises tungsten of sufficient thickness to confer substantial erosion and abrasion wear resistance characteristics to the coating system and a second layer away from the substrate comprises a mixture of tungsten and tungsten carbide.

BACKGROUND OF THE INVENTION

High hardness materials are widely used as coatings on various types of mechanical components and cutting tools. Such coatings impart erosion and abrasion wear resistance and thus increase the erosive and abrasive wear life of objects that have been coated. The high hardness materials can also be used to produce free standing objects which are erosive and abrasive wear resistant.

Chemical vapor deposition processes can be used to produce highly erosive and abrasive wear resistant hard coatings and free standing objects. In a typical chemical vapor deposition (CVD) process the substrate to be coated is heated in a suitable chamber and then a gaseous reactant mixture is introduced into the chamber. The gaseous reactant mixture reacts at the surface of the substrate to form a coherent and adherent layer of the desired coating. By varying the gaseous reactant mixture and the CVD process parameters, various types of deposited coatings can be produced.

In U.S. patent application Ser. No. 07/153,738, filed Feb. 8, 1988 a composite coating system comprising an intermediate layer of tungsten and an outer layer of tungsten/tungsten carbide was disclosed. The disclosed tungsten/tungsten carbide coatings exhibit an extremely hard, fine grained, non-columnar, substantially lamellar or layered structure produced by chemical vapor deposition.

The tungsten/tungsten carbide coatings disclosed in U.S. patent application Ser. No. 07/153,738 are comprised primarily of a mixture of a substantially pure tungsten phase and at least one carbide phase wherein the carbide phase consists of $W_2C$ or $W_3C$ or a mixture of $W_2C$ and $W_3C$. The coating system also employs a thickness ratio of tungsten to tungsten/tungsten carbide layer of $\geq 0.3$ to get optimum erosion and abrasion wear performance. The intermediate tungsten layer as claimed is believed to improve the impact and load bearing capacity of the composite coating by absorbing impact energy and by deflecting cracks produced in the tungsten/tungsten carbide coating on impact.

It has been found that the tungsten/tungsten carbide coatings such as those described in the aforementioned U.S. patent application, when deposited upon certain types of substrates, exhibit a very fine micro-crack system throughout the deposit. On many types of substrates and under many types of erosive and abrasive wear conditions, preferential attack occurs at the cracks, resulting in poor erosion and abrasion wear resistance for such coatings. Additionally, under many types of erosion and abrasion wear conditions, these coatings fail by spalling due to poor load and impact bearing capacity.

To improve the overall erosion and abrasion wear properties and eliminate cracks in the composite coatings, the aforementioned patent application disclosed limiting the thickness of the tungsten/tungsten carbide top coat to $\leq 14$ microns ($\mu$m) and using a ratio of thicknesses of tungsten interlayer to tungsten/tungsten carbide top coat of $\geq 0.3$. Limiting the tungsten/tungsten carbide coating thicknesses to $\leq 14$ $\mu$m, however, restricts the use of the composite coatings in many erosive or abrasive wear applications, where longer life and resistance to large particle impact are crucial. It is therefore desirable to increase the thickness of the tungsten/tungsten carbide coating without inducing cracks to prolong the useful life of many components.

The disclosed composite coating system provides a means of increasing the thickness of the tungsten/tungsten carbide coating without inducing cracks. The composite coating system comprises a plurality of composite layers. Each of the composite layers comprises a first layer toward the substrate of tungsten and a second layer away from the substrate of a mixture of tungsten and tungsten carbide. The thicknesses of tungsten and tungsten/tungsten carbide in each composite layer are carefully controlled to provide crack free coating and to optimize the erosion and abrasion wear properties load bearing capacity and resistance to large particle impact of the coating system.

SUMMARY OF THE INVENTION

Very generally, the highly erosive and abrasive wear and large particle impact resistant composite coating system of the invention comprises a plurality of composite layers on a substrate. Each of the composite layers comprises a first layer of tungsten and a second layer of a mixture of tungsten and tungsten carbide comprising $W_2C$, $W_3C$ or a mixture of both. The multi-layered coating system is believed to improve erosive and abrasive wear resistance of the substrate and to provide protection against impact of large particles, i.e. having a diameter of about 1 mm or more. The ratio of thickness of the first layer to the thickness of the second layer in each of the composite layers is at least above 0.30. Preferably within each composite layer, the ratio of the thickness of the first layer to the thickness of the second layer to get optimum erosion and abrasion wear performance and large particle impact resistance is at least 0.35 in the case of mixtures of tungsten and $W_2C$ in the second layer, 0.60 in the case of mixtures of tungsten and $W_3C$ in the second layer and, 0.35 in the case of mixtures of tungsten and $W_2C$ and $W_3C$ in the second layer.

Figure 2:
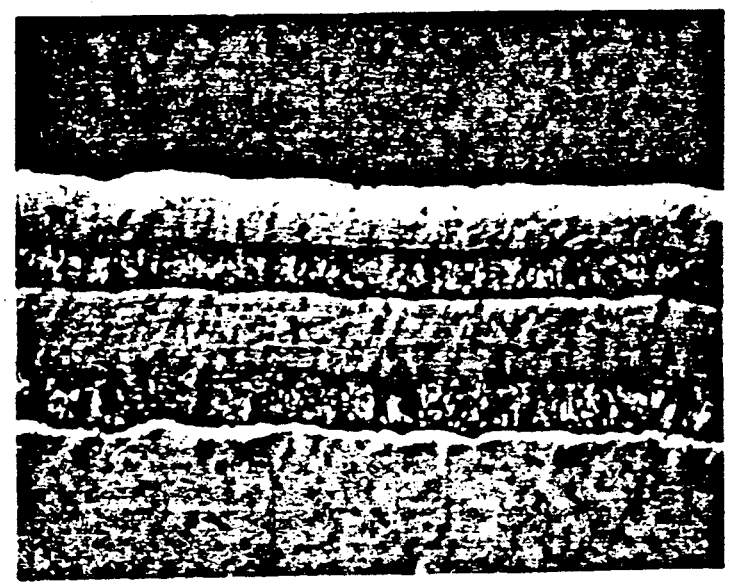

FIG. 2 is a photomicrograph at 1000 magnification of two composite layers each comprising a first layer of tungsten and a second layer of $W+W_2C$ on AM-350 stainless steel, in accordance with the invention, showing the absence of cracks. The overall coating thickness for the two sets of composite layers was ~37 μm.

Figure 3:

FIG. 3 is a photomicrograph at 1000 magnification of three sets of composite layers each comprising a first layer of tungsten and a second layer of $W+W_2C$ on AM-350 stainless steel, in accordance with the invention, showing the absence of cracks. The overall coating thickness for the three sets of composite layers was ~60 μm.

Figure 4:
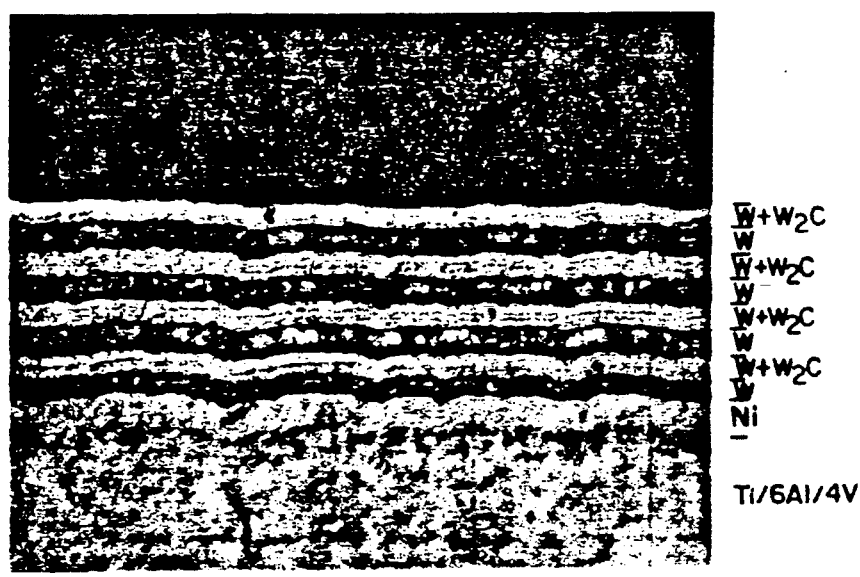

FIG. 4 is a photomicrograph at 1000 magnification of four composite layers, each comprising a first layer of tungsten and a second layer of $W+W_2C$ on titanium alloy (Ti/6Al/4v), in accordance with the invention, showing the absence of cracks. The overall coating thickness for four sets of composite layers was ~30 μm.

DETAILED DESCRIPTION OF THE INVENTION

In accordance with the present invention, the disclosed composite coating system eliminates the disadvantages and shortcomings associated with the prior art techniques. According to the invention a plurality of composite layers are provided to increase overall coating thickness without inducing micro-cracks, achieve optimum erosion and abrasion wear properties, and optimize large particle impact resistance of the coating system. The first layer in each composite layer comprises tungsten and the second layer comprises a mixture of tungsten and tungsten carbide.

In a preferred embodiment of the invention, the first layer of tungsten is produced on a substrate by chemical vapor deposition under sub-atmospheric to slightly above atmospheric pressure, i.e., within the range of about 1 Torr. to about 1,000 Torr., at a temperature of about 300° to about 550° C., using a mixture of tungsten halide such as $WF_6$, hydrogen, and an inert gas such as argon. The first layer is of a sufficient thickness to confer substantial erosive and abrasive wear and large particle impact resistance characteristics on the composite system. The specific thickness necessary to do this for various composite coating systems will become readily apparent to those skilled in the art from the teaching of this specification, particularly in connection with the examples set forth below. The first layer of tungsten should be at least about two microns thick, preferably in the range of about 2 to about 20 μm, and, for most systems, will be greater than about three microns.

Following deposition of the first layer of substantially pure tungsten, a second layer of tungsten/tungsten carbide is deposited under sub-atmospheric to slightly above atmospheric pressure, i.e., within the range of about 1 Torr. to about 1,000 Torr., at temperatures in the range of about 300° to about 550° C. The second layer may be either a two phase layer comprising tungsten and $W_2C$ or tungsten and $W_3C$. Alternatively, the second layer may be a three phase layer comprising tungsten, $W_2C$ and $W_3C$. The relative proportions of the tungsten $W_2C$, and $W_3C$ may be selected in accordance with the particular properties desired in the final composite coating system. In order to achieve such proportions, the tungsten/tungsten carbide deposit is applied utilizing a flow of tungsten halide such as $WF_6$, an inert gas such as argon, hydrogen and an oxygen containing hydrocarbon such as dimethylether (DME). By controlling the temperature, W/C atomic ratio in the feed gas and the ratio of hydrogen to $WF_6$ during the deposition reaction, the particular desired chemical composition of the tungsten/tungsten carbide layer may be obtained. The methods for the deposition of tungsten and tungsten/tungsten carbide are described in detail in the co-pending U.S. patent application Ser. No. 07/092,809, filed Sept. 3, 1987, which description is incorporated herein by reference. The subsequent heat treatment of tungsten and tungsten/tungsten carbide coating system to improve erosion and wear resistance is described in detail in applicant's co-pending U.S. patent application Ser. No. 07/157,550 filed Feb. 17, 1988.

In accordance with the present invention, it has been found that (1) the overall thickness of the coating system and (2) the ratio of the thickness of the first tungsten layer to the thickness of the second multi-phase tungsten/tungsten carbide layer have a profound affect on the erosive and abrasive wear and large particle impact resistance properties of the resulting composite coating system. Hence, the overall thickness of the disclosed composite coating system can be varied depending upon the requirements. In the preferred embodiment of the invention the overall thickness of the coating system may be increased by increasing number of sets of composite layer, which can range from 2 to >10.

The ratio of the thickness of the first tungsten layer to the thickness of the second tungsten/tungsten carbide layer, in accordance with the composite coating system of the invention, is at least above 0.30 with the $W+W_3C$, $W+W_2C+W_3C$ and $W+W_2C$ coatings. More specifically, to obtain optimum erosion and abrasion wear performance the thickness ratio is at least: 0.35 in the case of mixtures of tungsten and $W_2C$ in the second layer, 0.60 in the case of mixtures of tungsten and $W_3C$ in the second layer, and 0.35 in the case of mixtures of tungsten and $W_2C$ and $W_3C$ in the second layer. Furthermore, in order to obtain optimum large particle ($\geq 1$ mm) impact resistance, the overall thickness of the multilayer coating system is at least about 20 μm, preferably in a range up to about 100μ, with the $W+W_3C$, $W+W_2C+W_3C$ and $W+W_2C$ coatings. Using these minimum ratios and overall coating thickness preferably above about 40μ, superior erosive and abrasive wear, large particle impact resistance and high cycle fatigue strength can be achieved. Moreover, by using the ratios set forth above, a completely crack-free coating system may be achieved.

The first tungsten layer is substantially columnar in its grain structure with the longer dimension of the grains extending generally perpendicular to the substrate surface. On the other hand, the grain structure of the tungsten/tungsten carbide second layer is very fine-grained, equiaxed, non-columnar, and substantially lamellar or layered structure, typically of the order of one micron or less in size. Such structures may be readily achieved using the method described in the aforementioned co-pending U.S. patent application Ser. Nos. 07/092,809 and 07/153,738, the descriptions of which are incorporated herein by reference.

The disclosed composite coating system can be deposited on a number of ferrous metals and alloys such as cast irons, carbon steels, stainless steels and high speed steels, non-ferrous metals and alloys such as copper, nickel, platinum, rhodium, titanium, aluminum, silver, gold, niobium, molybdenum, cobalt, tungsten, rhenium, cooper alloys and nickel alloys such as inconel and monel, titanium alloys such as Ti/Al/V, Ti/Al/Sn, Ti/Al/Mo/V, Ti/Al/Sn/Zr/Mo, Ti/Al/V/Cr, Ti/Mo/V/Fe/Al, Ti/Al/V/Cr/Mo/Zr and Ti/Al/V/Sn alloys, non-metals such as graphite, carbides such as cemented carbide, and ceramics such as silicon carbide, silicon nitride, alumina, and the like. In depositing the composite coating system on reactive substrate materials, such as cast irons, carbon steels, stainless steels, high speed steels, and nickel and monel alloys, it is preferred to coat the substrate first with a more noble material such as nickel, cobalt, copper, silver, gold, platinum, palladium or iridium, by electrochemical or electroless techniques of by a physical vapor deposition technique such as sputtering. In depositing the composite coating system on reactive titanium or titanium alloys, it is also preferred to coat the substrate first with a more noble material described above by an electroless technique or by a physical vapor deposition technique such as sputtering. It is also preferred to coat the substrate first with a thin layer, preferably a thickness between about 0.05 microns and about 5 microns, of a more noble material described above by an electroless technique followed by another thin layer of a more noble material by an electrochemical or physical vapor deposition technique. It is also preferred to clean the surface of the titanium or titanium alloy substrate first and heat treat the noble metal deposit after depositing on the substrate. The deposition of noble metal and subsequent heat treatment steps on titanium or titanium alloys are described in detail in co-pending U.S. patent application Ser. No. 07/139,891, filed Dec. 31, 1987. It is also preferred that upper limit of the deposition temperature be about 525° C. when depositing the present composite coating system on titanium and titanium alloys to minimize the degradation of the mechanical properties. No deposition of the noble material, however, is required for coating non-reactive materials such as copper, nickel, cobalt, silver, gold, platinum, rhodium, niobium, molybdenum, tungsten, rhenium, graphite, carbides and ceramics. Free standing parts of the composite coating of the present invention can be made by depositing it on the substrates such as copper, nickel cobalt, silver, gold, molybdenum, rhenium, and graphite and then removing these substrates by grinding and chemical or electrochemical etching.

To further illustrate the present invention, the following data are set forth.

A number of AM-350 stainless steel and titanium alloys such as Ti/6Al/4V, were used as substrates in the following coating experiments. The AM-350 stainless steel specimens were electroplated with 2-5 μm thick nickel before coating them with tungsten (W) and tungsten/tungsten carbide ($W + W_2C$) to protect them from the attack of hot and corrosive HF acid gas produced as a by-product in the CVD process. Specimens made of titanium alloy such as Ti/6Al/4V, on the other hand, were plated with 2 to 5 μm thick nickel using an electroless plating technique described in detail in the U.S. patent application Ser. No. 07/139,891, filed December 31, 1987, before coating them with tungsten and tungsten/tungsten carbide.

EROSION TEST PROCEDURE

The erosion resistance performance of the coated specimens was determined using a miniature sandblast unit; the test parameters are summarized in Table 1. The fine alumina powder, which was used as the erosive material, provided a very harsh erosion environment, as compared to sand erosion; consequently, an accelerated test procedure could be used. The erosion resistance was evaluated by measuring the time it took for the erosive material to penetrate the coating, which is called the breakthrough time. Penetration of the coating was visibly apparent as a color change at the center of the erosion pit, the fact that this color change corresponded to the initial penetration of the coating was confirmed by microscopic examination of erosion pit in cross section.

FATIGUE TEST PROCEDURE

A number of coated and uncoated AM-350 stainless steel cantilever fatigue bend (modified Krause) test specimens were tested for high cycle fatigue strength using Sonntag model #SF-2 rotating mass type fatigue testing machine. The test specimens were clamped on both ends and subjected to constant force sinusoidal form of 30 Hz frequency using a machine oscillator. The specimens were tested at room temperature with a stress ratio of A = alternating stress/mean stress of infinity (fully) reversed. The stress level was varied and the test continued until $10^7$ cycles or failure indicated by breakage of the test specimen, whichever came first.

EXAMPLES OF TUNGSTEN AND TUNGSTEN/TUNGSTEN CARBIDE COATINGS

EROSION ANALYSIS

EXAMPLE 1

Several AM-350 and Ti/6Al/4V specimens preplated with nickel were placed in an inductively heated graphite reactor inside a gas-tight quartz envelope. They were then heated to a temperature of 460° C. in the presence of flowing argon in the CVD reactor. At the reaction temperature a gaseous mixture of 300 SCCM of $WF_6$, 3,000 SCCM of $H_2$, and 6.525 SCCM of argon was passed into the reactor for 15 minutes to coat them with tungsten (W). After coating specimens with W, a gaseous mixture of 300 SCCM of $WF_6$, 3,000 SCCM of $H_2$ and 85 SCCM of dimethylether (DME) was passed into the reactor for 70 minutes to provide tungsten/tungsten carbide coating. The coated specimens were then heat treated at 460° C. for 60 minutes in flowing argon gas. The total pressure was maintained at 40 Torr. during the entire coating process.

The specimens were coated with W and $W + W_2C$ of thicknesses ~8 μm and ~23 μm, respectively, as shown in Table 2. The total coating thickness of the single set of W and $W + W_2C$ was ~31 μm. The coating on the specimens showed presence of fine micro-cracks, caused by the deposition of thick $W + W_2C$ coating. The erosion resistance of the coating in the crack-free region was high, as shown in Table 2. It was, however, low in the cracked region. This example, therefore, showed a need for eliminating cracks to provide good erosion resistance over the entire surface of the coated specimens.

EXAMPLE 2

The coating process described in Example 1 was repeated to deposit a thicker tungsten interlayer using 300 SCCM of $WF_6$, 3,000 SCCM of $H_2$ and 6,525 SCCM of argon at 460° C. for 30 minutes followed by deposition of tungsten/tungsten carbide using 300 SCCM of $WF_6$, 3,000 SCCM of $H_2$ and 85 SCCM of DME at 460° C. for 70 minutes. The specimens were coated with tungsten and tungsten/tungsten carbide of thicknesses ~25 μm and ~26 μm, respectively. The top coat consisted of a mixture of W+W$_2$C, and was cracked. The erosion resistance of the coating in the crack-free region was high, as shown in Table 2. The erosion resistance was, however, low in the cracked region.

This example indicated that increasing the thickness of the first layer of W was not effective in eliminating cracks in the thick W+W$_2$C second layer. It also confirmed the need for eliminating cracks in the coating system to optimize the overall erosive and abrasive wear resistance provided by the coating.

EXAMPLE 3

Figure 1:
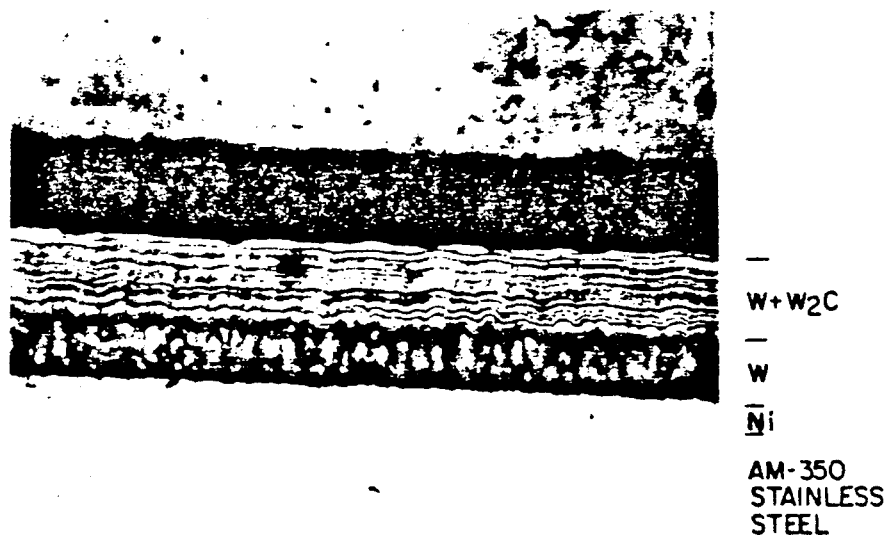
FIG. 1 is a photomicrograph at 1,000 magnification of a single composite layer comprising a first layer of tungsten and a second layer of $W + W_2C$ on AM-350 stainless steel, showing the absence of cracks. The overall coating thickness was ~22 μm in this case.

The coating process described in Example 1 was repeated to deposit ~9 μm thick W using 250 SCCM of WF$_6$, 2,500 SCCM of H$_2$, and 7,975 SCCM of argon at 460° C. for 18 minutes followed by deposition of ~13 μm thick W+W$_2$C second layer using 300 SCCM of WF$_6$, 3,000 SCCM of H$_2$, 2,610 SCCM of argon and 90 SCCM of DME at 460° C. for 65 minutes. The coating consisted of a columnar W first layer followed by fine-grained, layered W+W$_2$C second layer as shown in FIG. 1. The W+W$_2$C second layer was crack-free.

The erosion resistance of the coating system based upon breakthrough time was lower than the coatings of Examples 1 and 2, but the erosion resistance was uniform in all the coated area. It was better than the erosion resistance in the cracked regions of the coating systems in Examples 1 and 2.

This example further confirmed the importance of depositing a crack-free coating system for improving erosion resistance. It also indicated that the breakthrough time in the crack-free region of coatings of Examples 1 and 2 was considerably higher than that of Example 3. Therefore increasing the thickness of the W+W$_2$C coating was imperative to improve erosion resistance.

EXAMPLE 4

Several AM-350 and Ti/6Al/4V specimens were heated to a temperature of 460° C. in the presence of flowing argon in a CVD reactor described in Example 1. The specimens were then coated with two sets of alternating composite layers of W and W+W$_2$C using the following conditions:

| Layer Number | Coating | WF$_6$ | Flow Rate of gases, SCCM H$_2$ | Ar | DME | Pressure, Torr | Time, Min. |
|---|---|---|---|---|---|---|---|
| 1st | W | 250 | 2,500 | 8,700 | — | 40 | 20 |
| 2nd | W + W$_2$C | 300 | 3,000 | 3,480 | 90 | 40 | 90 |
| 3rd | W | 250 | 2,500 | 8,700 | — | 40 | 15 |
| 4th | W + W$_2$C | 300 | 3,000 | 3,480 | 90 | 40 | 80 |

The coated specimens were then heat treated at 460° C. for 60 minutes in the flowing argon gas.

The specimens were coated with two sets of alternating composite layers of W followed by W+W$_2$C, as shown in FIG. 2. The thicknesses of these layers were (in order, away from the metal substrate) ~8 μm (W), ~12 μm (W+W$_2$C), ~7 μm (W), and ~10 μm (W+W$_2$C). The total coating thickness of the two sets was ~37 μm. The erosion resistance breakthrough time was ~320 seconds, and it was uniform over the entire coated surface, as shown in Table 3.

This example therefore indicated that a thick, crack-free and erosion resistant coating can be deposited by alternating layers of W and W+W$_2$C.

EXAMPLE 5

Several Ti/6Al/4V specimens were heated to a temperature of 457° C. in the presence of flowing argon in the CVD reactor described in Example 1. The specimens were then coated with two sets of alternating composite layers of W and W+W$_2$C using the following conditions:

| Layer Number | Coating | WF$_6$ | Flow Rate of gases, SCCM H$_2$ | Ar | DME | Pressure, Torr | Time, Min. |
|---|---|---|---|---|---|---|---|
| 1st | W | 150 | 1,500 | 11,600 | — | 40 | 30 |
| 2nd | W + W$_2$C | 300 | 3,000 | 3,190 | 95 | 40 | 75 |
| 3rd | W | 150 | 1,500 | 11,600 | — | 40 | 30 |
| 4th | W + W$_2$C | 300 | 3,000 | 3,190 | 95 | 40 | 75 |

The coated specimens were then heat treated at 457° C. for 60 minutes in the flowing argon gas.

The specimens were coated with two sets of alternating composite layers of W followed by W+W$_2$C. The coating thicknesses of the layers were (in order, away from the substrate) 7.0 μm (W), 14 μm (W+W$_2$C), 6.5 μm (W) and 13.2 μm (W+W$_2$C). The total coating thickness of the two sets was ~40.7 μm, and it was crack-free. The erosion resistence breakthrough time test was ~323 seconds, and it was uniform on the entire coated surface, as shown in Table 3.

This example once again indicated that a thick, crack-free and erosion resistant coating can be deposited by alternating layers of W and W+W$_2$C.

EXAMPLE 6

Several Ti/6Al/4V specimens were heated to a temperature of 457° c. in the presence of flowing argon and coated in a CVD reactor described in Example 1 with three sets of alternating composite layers of W and W+W$_2$C using the following conditions:

| Layer Number | Coating | WF$_6$ | Flow Rate of gases, SCCM H$_2$ | Ar | DME | Pressure, Torr | Time, Min. |
|---|---|---|---|---|---|---|---|
| 1st | W | 150 | 1,500 | 11,600 | — | 40 | 30 |
| 2nd | W + W$_2$C | 300 | 3,000 | 3,190 | 95 | 40 | 75 |
| 3rd | W | 150 | 1,500 | 11,600 | — | 40 | 30 |
| 4th | W + W$_2$C | 300 | 3,000 | 3,190 | 95 | 40 | 75 |
| 5th | W | 150 | 1,500 | 11,600 | — | 40 | 30 |
| 6th | W + W$_2$C | 300 | 3,000 | 3,190 | 95 | 40 | 75 |

The coated specimens where then heat treated at 457° C. for 60 minutes in the flowing argon gas.

The specimens were coated with three sets of alternating composite layers of W followed by W+W$_2$C. The coating thicknesses of the layer were (in order, away from the substrate) 7.1 μm (W), 13.0 μm (W+W$_2$C), 7.8 μm (W), 13.1 μm (W+W$_2$C), 7.0 μm (W) and 12.0 μm (W+W$_2$C). The total coating thickness of the three sets was ~60 μm, and it was crack-free, as shown in FIG. 3. The erosion resistance breakthrough time was ~423 seconds, and it was uniform over the entire coated surface, as shown in Table 3.

This example further indicated that a thick, crack-free and erosion resistant coating can be deposited by alternating layers of W and W+W$_2$C.

EXAMPLE 7

Several Ti/6Al/4V specimens were heated to a temperature of 458° C. in the presence of flowing argon and coated in a CVD reactor described in Example 1 with four sets of alternating composite layers of W and W+W$_2$C using the following conditions:

| Layer Number | Coating | FLow Rate of gases, SCCM | | | | Pressure, Torr | Time, Min. |
|---|---|---|---|---|---|---|---|
| | | WF$_6$ | H$_2$ | Ar | DME | | |
| 1st | W | 150 | 1,500 | 11,000 | — | 40 | 10 |
| 2nd | W + W$_2$C | 300 | 3,000 | 3,000 | 85 | 40 | 20 |
| 3rd | W | 150 | 1,500 | 11,000 | — | 40 | 10 |
| 4th | W + W$_2$C | 300 | 3,000 | 3,000 | 85 | 40 | 20 |
| 5th | W | 150 | 1,500 | 11,000 | — | 40 | 10 |
| 6th | W + W$_2$C | 300 | 3,000 | 3,000 | 85 | 40 | 20 |
| 7th | W | 150 | 1,500 | 11,000 | — | 40 | 10 |
| 8th | W + W$_2$C | 300 | 3,000 | 3,000 | 85 | 40 | 20 |

The coated specimens were then heat treated at 458° C. for 60 minutes in flowing argon gas.

The specimens were coated with four sets of alternating composite layers of W followed by W+W$_2$C. The coating thicknesses were (in order, away from the substrate) 2.9 μm (W), 3.7 μm (W+W$_2$C), 4.0 μm (W), 4.9 μm (W+W$_2$C), 3.7 μm (W), 3.9 μm (W+W$_2$C), 4.0 μm (W), and 3.2 μm (W+W$_2$C). The total coating thickness of four sets was ~30.3 μm, and it was crack-free, as shown in FIG. 4. This result demonstrates the synergistic effect of using alternating sets of tungsten and tungsten/tungsten carbide in eliminating surface cracks when comparing this result with that obtained with the single set as shown in Example 1 above.

This example showed that the number of alternating composite layers of W and W+W$_2$C, overall coating thickness, and thicknesses of W and W+W$_2$C layers can be varied to produce crack-free coating.

FATIGUE ANALYSIS

EXAMPLE 8

The high cycle fatigue strength of uncoated AM-350 stainless steels test specimens was determined by varying the applied stress level from 55 to 75 KSI. The test results summarized in Table 4 indicated that the uncoated specimens surpassed the endurance limit of $10^7$ cycles at a stress level of $\geq 60,000$ psi. The test specimens broke into two pieces in 25,000 and 13,000 cycles at 65,000 and 75,000 psi stress levels, respectively. The test results therefore indicated the high cycle fatigue strength of uncoated (as-received specimens) to be ~60 KSI.

EXAMPLE 9

A number of AM-350 stainless steel fatigue test specimens were plated with ~4 μm thick nickel interlayer using electrolytic plating technique. The nickel plated specimens were placed in an inductively heated graphite reactor inside a gas-tight quartz envelope similar to the one used in Example 1. The specimens were heat treated in the reactor by subjecting them to standard W followed by W+W$_2$C coating conditions without the use of hydrogen, tungsten hexafluoride and dimethylether. For example, the nickel plated specimens were heated to 460° C. in the presence of 11,600 SCCM of argon at 40 Torr. When the temperature in the reactor reached 460° C., it was maintained for 40 minutes under flowing argon and at 40 Torr. total pressure. After 40 minutes the flow rate of argon was reduced to 7,830 SCCM and maintained for 65 minutes to simulate W+W$_2$C conditions. The specimens were then heat treated at 460° C. using 11,600 SCCM of argon and 40 Torr. for an additional 60 minutes. The specimens were then cooled to room temperature under flowing argon.

The nickel plated and heat treated specimens were then tested for high cycle fatigue strength. The fatigue strength of these specimens was noted to be between 60-65 KSI. as shown in Table 4. The fatigue test results therefore indicated that the high cycle fatigue strength of the specimens did not degrade by nickel plating followed by heat treating.

EXAMPLE 10

A number of AM-350 stainless steel fatigue test specimens were nickel plated and coated with W and W+W$_2$C in two coating runs using the procedure described in Example 1. The specimens were heated to 457° C. in the presence of flowing argon gas, and at the temperature they were coated with tunsten for 25 minutes by flowing a gaseous mixture of 150 SCCM of WF$_6$, 1,500 SCCM of H$_2$, 11,600 SCCM of argon. After coating the specimens with W for 25 minutes, a gaseous mixture of 300 SCCM of WF$_6$, 3.000 SCCM of H$_2$, 3,190 SCCM of argon, and 95 SCCM of DME was passed into the furnace for 70 minutes to provide a W+W$_2$C coating. A total pressure was maintained at 40 Torr during W and W+W$_2$C coating steps. After coating the specimens, they were heat treated at 457° C. under 11,600 SCCM of flowing argon for 60 minutes at 40 Torr. The specimens were then cooled to room temperature under flowing argon gas.

The specimens were coated with a 100 μm thick W first layer and a 13 μm W+W$_2$C second layer, as shown in Table 4. The coating was absolutely crack-free and had thickness of 23 μm. The high cycle fatigue strength of the coated specimens surpassed that of uncoated and nickel plated followed by heat treated specimens, as shown in Table 4. The high cycle fatigue strength of the coated specimens was ~83 KSI, as shown in Table 4. This example, therefore, showed that a crack-free W followed by W+W$_2$C coating improved the high cycle fatigue properties of the AM-350 stainless steel.

EXAMPLE 11

Several AM-350 stainless steel fatigue test specimens pre-plated with electroytic nickel were coated in two experimental runs with two sets of alternating composite layers of W and W+W$_2$C. The specimens were heated to a temperature of 457° C. in the presence of flowing argon in a CVD reactor similar to the one used in Example 1. The specimens were coated using the following conditions:

| Layer Number | Coating | FLow Rate of gases, SCCM | | | | Pressure, Torr | Time, Min. |
|---|---|---|---|---|---|---|---|
| | | WF$_6$ | H$_2$ | Ar | DME | | |
| 1st | W | 150 | 1,500 | 11,600 | — | 40 | 25 |
| 2nd | W + W$_2$C | 300 | 3,000 | 3,190 | 95 | 40 | 65 |
| 3rd | W | 150 | 1,500 | 11,600 | — | 40 | 25 |
| 4th | W + W$_2$C | 300 | 3,000 | 3,190 | 95 | 40 | 65 |

The coated specimens were then heat treated at 457° C. for 60 minutes in flowing argon gas.

The specimens were coated with two sets of alternating composite layers of W and W+W$_2$C. The thicknesses of these layers were (in order, away from the substrate) 7.2 μm (W), 13.7 μm (W+W$_2$C), 9.2 μm (W), and 12.3 μm (W+W$_2$C). The total coating thickness of the two sets was ~42.4 μm, and the coating was crack-free. The high cycles fatigue strength of the specimens with composite coating surpassed that of the specimens deposited with single composite layer of W and W+W$_2$C, as shown in Table 4 (Example 10). The high cycle fatigue strength of the specimens exceeded 90 KSI, which was an unexpected finding. This example, therefore, shown that a multilayer composite coating system is extremely useful in improving high cycle fatigue strength of AM-350 stainless steel.

EXAMPLE 12

Several Ti/6Al/4V specimens were heated to a temperature of 456° C. in the presence of flowing argon in a CVD reactor described in Example 1. The specimens were then coated with two sets of alternating composite layers of W and W+W$_2$C using the following conditions:

| Layer Number | Coating | FLow Rate of gases, SCCM | | | | Pressure, Torr | Time, Min. |
|---|---|---|---|---|---|---|---|
| | | WF$_6$ | H$_2$ | Ar | DME | | |
| 1st | W | 150 | 1,500 | 11,600 | — | 40 | 30 |
| 2nd | W + W$_2$C | 300 | 3,000 | 3,190 | 95 | 40 | 80 |
| 3rd | W | 150 | 1,500 | 11,600 | — | 40 | 30 |
| 4th | W + W$_2$C | 300 | 3,000 | 3,190 | 95 | 40 | 80 |

The specimens were coated with two sets of alternating composite layers of W followed by W+W$_2$C. The thicknesses of these layers were (in order, away from the metal substrate) ~8 μm(W), ~13.5 μm(W+W$_2$C), ~9 μm(W), and ~2.7 μm(W+W$_2$C). The total thickness of the two sets was ~5 43.2 μm.

One of the coated specimens was subjected to an impact of ~1 mm single particle at ~1,000 ft/sec velocity. The coating withstood the impact of the particle at high velocity without showing any signs of coating spallation. The impact caused a dent in the coating as well as the substrate, indicating its superior impact resistance. Cross-sectional analysis of the impacted area revealed presence of a number of cracks in both W+W$_2$C layers. The first tungsten layer of the second set was instrumental in absorbing the stress caused by the impact of the particle and deflecting cracks produced by the impact. The first tungsten layer of the first set, i.e. the layer closest to the substrate, completely arrested the cracks and prevented their propogation to the substrate.

This example, therefore, showed superior crack deflection, crack arresting and large particle impact resistance properties of the composite multi-layered coating system.

DISCUSSION

The above examples clearly demonstrate that a composite coating system comprising a plurality of composite layers can be employed to deposit thick tungsten/tungsten carbide coatings without inducing cracks. The overall thickness of the coating system can be varied by using 2 or more sets of alternating composite layers of tungsten and tungsten/tungsten carbide. The coating system can also be tailored to particular applications by varying the thickness of tungsten and tungsten/tungsten carbide composite layers. The composite coating system provides excellent protection against large particle erosion by absorbing the impact energy and achieves optimum abrasion wear life. Furthermore, the coating system significantly enhances the high cycle fatigue strength of the base substrate material. Because of the improved physical properties of the composite coating system, it finds particular application in turbine blades subjected to severe cycle fatigue stress.

TABLE 1

| Erosion Test Procedure | |
|---|---|
| Nozzle Diameter | 0.018 inch |
| Stand-off-Distance | 0.6 inch |
| Erosion Media | Fine Alumina Powder (50 μm Average Particle Size) |
| Supply Pressure | 32 psig |
| Flow Rate of Erosion | 1.6 g/min |
| Impingement Angle | 90° |
| Erosion Test Standard | Breakthrough Time |

TABLE 2

| | Example 1 | | Example 2 | | Example 3 | |
|---|---|---|---|---|---|---|
| Experiment No. | 69 | | 68 | | 123 | |
| Substrate | AM-350 | Ti/6Al/4V | AM-350 | Ti/6Al/4V | AM-350 | Ti/6Al/4V |
| Coating Thicknesses, μm | | | | | | |
| W | 8.0 | 10.0 | 25.0 | 23.0 | 8.8 | 9.0 |
| W + W$_2$C | 23.0 | 23.0 | 27.0 | 26.0 | 12.7 | 13.1 |
| Total | 31.0 | 33.0 | 52.0 | 49.0 | 21.5 | 22.1 |
| W Thickness | 0.35 | 0.43 | 0.93 | 0.88 | 0.69 | 0.68 |
| W + W$_2$C Thickness | | | | | | |
| Surface Topography | Smooth, Interconnected Cracks | | Smooth, Cracks | | Smooth, No Cracks | |
| Coating Properties | | | | | | |
| Top Coat (W +W$_2$C) Hardness, Kg/mm$^2$ | 3060 ± 230 | 2792 ± 60 | 2758 ± 31 | 2689 ± 159 | 2324 ± 50 | 2511 ± 116 |
| Erosion Breakthrough Time, Secs. | — | 304 | 356 | 325 | 162 | 172 |

TABLE 3

| | Example 4 | | Example 5 | Example 6 | Example 7 |
|---|---|---|---|---|---|
| Experiment No. | 217 | | 546 | 547 | 596 |
| Substrate | AM-350 | Ti/6Al/4V | Ti/6Al/4V | Ti/6Al/4V | Ti/6Al/4V |
| Sets of Alternating Composite layers | 2 | | 2 | 3 | 4 |
| Combined Coating Thickness, μm | | | | | |
| W | 15.7 | 15.0 | 13.5 | 21.9 | 14.6 |
| W + $W_2C$ | 22.1 | 21.8 | 27.2 | 38.1 | 15.7 |
| Total | 37.8 | 36.8 | 40.7 | 60.0 | 30.3 |
| Top Coat Composition | W + $W_2C$ | | W + $W_2C$ | W + $W_2C$ | W + $W_2C$ |
| Surface Topography | Smooth, Crack-free | | Smooth, Crack-Free | Smooth, Crack-Free | Smooth, Crack-Free |
| Coating Properties | | | | | |
| Top Coat (W + $W_2C$) Hardness, kg/mm² | 2190 | 2276 | — | — | — |
| Erosion Breakthrough Time, Seconds | 331 | 315 | 323 | 423 | — |

TABLE 4

High Cycle Fatigue Test Results

| Example No. | Nickel Interlayer Thickness, μm | Overall Thickness of Hard Coating, μm W | Overall Thickness of Hard Coating, μm W + $W_2C$ | Applied Stress, KSI | Number of Cycles |
|---|---|---|---|---|---|
| 8 | — | — | — | 55 | Ran Out |
| | | | | 60 | Ran Out |
| | | | | 65 | 25,000 |
| | | | | 75 | 13,000 |
| 9 | 4 | — | — | 55 | Ran Out |
| | | | | 60 | Ran Out |
| | | | | 65 | Ran Out |
| | | | | 65 | 129,000 |
| 10 | 4 | 10 | 13 | 55 | Ran Out |
| | | | | 60 | Ran Out |
| | | | | 65 | Ran Out |
| | | | | 70 | Ran Out |
| | | | | 80 | Ran Out |
| | | | | 83 | Ran Out |
| | | | | 85 | 59,000 |
| 11 | 4 | 16.4 | 26.0 | 65 | Ran Out |
| | | | | 70 | Ran Out |
| | | | | 75 | Ran Out |
| | | | | 80 | Ran Out |
| | | | | 85 | Ran Out |
| | | | | 90 | Ran Out |

Ran Out means that the specimen did not fail in $10^7$ cycles.

What is claimed is:

1. A low temperature chemical vapor deposition method for increasing the erosion and abrasion wear life, providing protection against impact of large particles and improving high cycle fatigue strength of substrates, said method comprising chemical vapor depositing a first layer of substantially pure columnar tungsten onto a substrate selected from the group consisting of ferrous metals and alloys, non-ferrous metals and alloys, graphite, carbides and ceramics at a temperature in the range of about 300° to about 550° C.; chemical vapor depositing onto said first layer a second layer of a mixture of tungsten and tungsten carbide wherein said tungsten carbide is selected from the group consisting of $W_2C$, $W_3C$, and mixtures of $W_2C$ and $W_3C$ at a temperature in the range of about 300+ to about 550° C., said second layer being fine grained, non-columnar, having a substantially layered microstructure and a thickness sufficient to confer a desired degree of erosive and abrasive wear resistance and protection against impact of large particles on said substrate; repeating the chemical vapor deposition steps to result in a composite coating system comprising at least two sets of alternating first and second layers such that the overall thickness of said composite coating system is at least about 20 μm.

2. A method according to claim 1 wherein the thickness of said first layer is at least about 30% of the thickness of said second layer.

3. A method according to claim 1 wherein the ratio of thickness of said first layer to the thickness of said second layer in each of said alternating sets of composite layers is at least 0.35 in the case of tungsten plus $W_2C$ in the second layer, 0.60 in the case of a mixture of tungsten and $W_3C$ in the second layer and, 0.35 in the case of mixtures of tungsten and $W_2C$ and $W_3C$ in the second layer.

4. A method according to claim 1 wherein the outermost one of said second layers is substantially crack-free.

5. A method according to claim 1 wherein the number of sets of composite layers in said composite coating system ranges from 2 to 10.

6. A method according to claim 1 wherein the overall thickness of the composite coating system is at least above about 40 μm for optimum impact resistance to large particles and improve high cycle fatigue strength.

7. A method according to claim 1 wherein a primary layer is provided between said substrate and the adjacent composite layer, said primary layer being comprised of a metal selected from the group consisting of cobalt, rhodium, iridium, nickel, palladium, platinum, copper, silver and gold, alloys thereof and mixtures thereof and having a thickness sufficient to protect said substrate from corrosion during chemical vapor deposition.

8. A method according to claim 7 wherein said primary layer of inert metal is deposited by electrochemical, electroless or physical vapor deposition techniques.

9. A method according to claim 8 wherein the thickness of said primary layers of inert metal is between about 0.05 μm to about 5 μm.

10. A method according to claim 9 wherein said first layer is at least 2 μm thick.

11. A method according to claim 10 wherein the thickness of said first layer is between about 2 and 20 μm.

12. A method according to claim 11 wherein the overall thickness of said composite coating system is up to about 100 μm.

13. A method according to claim 1 wherein the thickness of said first layer is greater than the thickness of said primary layer.